(12) United States Patent
Kuznetsov et al.

(10) Patent No.: US 10,323,627 B2
(45) Date of Patent: Jun. 18, 2019

(54) PUMP UNIT WITH ELECTRIC DRIVE

(71) Applicant: Andrey Leonidovich Kuznetsov

(72) Inventors: Andrey Leonidovich Kuznetsov, Moscow (RU); Andrey Aleksandrovich Rukhman, Moscow (RU)

( * ) Notice: Subject to any disclaimer, the term of this patent is extended or adjusted under 35 U.S.C. 154(b) by 566 days.

(21) Appl. No.: 14/421,830

(22) PCT Filed: Aug. 15, 2013

(86) PCT No.: PCT/RU2013/000728
§ 371 (c)(1),
(2) Date: Mar. 29, 2017

(87) PCT Pub. No.: WO2014/027931
PCT Pub. Date: Feb. 20, 2014

(65) Prior Publication Data
US 2017/0211559 A1   Jul. 27, 2017

(30) Foreign Application Priority Data
Aug. 17, 2012   (RU) ................................ 2012135386

(51) Int. Cl.
*F04B 17/00* (2006.01)
*F04B 43/09* (2006.01)
(Continued)

(52) U.S. Cl.
CPC .......... *F04B 17/003* (2013.01); *E21B 43/128* (2013.01); *F04B 9/06* (2013.01);
(Continued)

(58) Field of Classification Search
CPC ............................. F04B 17/003; F04B 43/095
See application file for complete search history.

(56) References Cited

U.S. PATENT DOCUMENTS 5,319,257 A * 6/1994 McIntyre ............... H02N 2/023
310/328
5,751,090 A * 5/1998 Henderson ............. B82Y 15/00
310/328
(Continued)

FOREIGN PATENT DOCUMENTS

JP        2008025379 A *  2/2008

*Primary Examiner* — Daniel J Colilla

(57) ABSTRACT

The technical solution relates to devices for pumping fluid media and can be used in industry, transport and the home for pumping liquids and other incompressible and compressible fluid media as well as for extracting oil from wells. The pump assembly with an electric drive consists of a housing, an electric drive armature situated inside the housing, and a displacer situated in the fore end of the housing, wherein the electric drive armature and the displacer are connected to one another. The displacer is in the form of a piston. The electric drive armature consists of the following, connected in series: an electric drive rear spacing block, an electric drive motion block capable of moving relative to the housing in the direction of a change in the length of the motion block, and an electric drive fore spacing block. Unlike the closest prior art, at least one electric drive spacing block is in the form of a magnetostrictive spacing block, and/or the electric drive motion block is in the form of a magnetostrictive motion block. The invention is intended to solve the technical problem of extending the range of existing technical equipment. The positive result of realizing the invention is that of achieving this purpose.

12 Claims, 7 Drawing Sheets

(51) Int. Cl.
    *F04B 43/04*     (2006.01)
    *F04B 17/03*     (2006.01)
    *F04B 53/16*     (2006.01)
    *H02N 2/02*     (2006.01)
    *H01L 41/12*     (2006.01)
    *E21B 43/12*     (2006.01)
    *F04B 9/06*     (2006.01)
    *F04B 47/06*     (2006.01)
    *F04B 11/00*     (2006.01)
    *F04B 53/00*     (2006.01)
    *F04B 53/14*     (2006.01)

(52) U.S. Cl.
    CPC .............. *F04B 11/00* (2013.01); *F04B 17/03* (2013.01); *F04B 43/046* (2013.01); *F04B 43/095* (2013.01); *F04B 47/06* (2013.01); *F04B 53/003* (2013.01); *F04B 53/14* (2013.01); *F04B 53/16* (2013.01); *H01L 41/12* (2013.01); *H02N 2/023* (2013.01)

(56) References Cited

U.S. PATENT DOCUMENTS

| | | | | |
|---|---|---|---|---|
| 6,157,101 | A * | 12/2000 | Ullakko | H01L 41/12 310/26 |
| 6,246,132 | B1 * | 6/2001 | Joshi | H01L 41/12 310/26 |
| 7,045,932 | B2 * | 5/2006 | Xu | H02N 2/023 310/12.31 |
| 7,503,756 | B2 * | 3/2009 | Dooley | F04B 17/00 417/322 |
| 7,548,010 | B2 * | 6/2009 | Browne | F03G 7/065 310/26 |
| 2006/0197167 | A1 * | 9/2006 | Dooley | H01L 41/12 257/421 |

* cited by examiner

PUMP UNIT WITH ELECTRIC DRIVE

FIELD OF THE INVENTION

The technical solution relates to devices for pumping fluid media and can be used in industry, transport and the home for pumping liquids and other incompressible and compressible fluid media as well as for extracting oil from wells.

BACKGROUND OF THE INVENTION

The closest prior art of the claimed technical solution is a piezoelectric pump unit for pumping fluids described in the patent RU2452872, published Jun. 10, 2012, Int'l Class 8 F04B 9/00. The pump unit consists of a housing, an electrically driven armature, located in the housing, and a displacer, located in the front part of the housing. The electrically driven armature and the displacer are connected. The electrically driven armature consists of a rear electrically driven clamp section, an electrically driven extender section capable of moving relative to the housing in the direction of changing its length, and a front electrically driven clamp section, connected in series. The electrically driven clamp sections and the extender section are made with piezoelectric material capable to change its length at supplying an electric potential to it, for example of piezoceramic material.

Electrical pulses coming to the electrically driven clamp sections cause them to lock in the housing one-by-one. The electrically driven extender section provides periodical movement of the clamp section that is not fixed in the housing at one step under influence of an electrical pulse coming to it. This causes an Inch-Worm movement of the displacer relatively to the housing in one direction.

The piezoelectric materials used in the construction described, are characterized by a certain heat resistance. (Curie temperature), low energy loss during operation, low strength (brittleness). However there are means changing its dimensions at supplying electrical voltage to it, that can also be applied in the pump unit construction. These are magnetostrictive devices. Magnetostrictive device generally consists of a closed magnetic circuit whose material is magnetostrictive material, i.e. material that changes its length when magnetic field changes in it, and of induction coils generating that magnetic field. Most magnetostrictive materials differs from piezoelectric materials in a greater mechanical strength, that allows you to create a more reliable pump unit. A certain class of magnetostrictive materials (with the "giant" magnetostriction), despite the fragility and high cost, is characterized by high rigidity and high elongation at magnetic field variation. A large number of magnetostrictive materials has a great heat resistance as compared with the piezoelectric materials. Usage of magnetostrictive devices of different types, that may be applied in the same pump unit, along with the piezoelectric devices or instead of them, allows us to create pump units with electric drive having a broader range of performance properties, such as working life, flow, maximum temperature, efficiency, maintainability.

SUMMARY OF THE INVENTION

Thus, the technical problem to be solved by the present technical solution is to extend the existing number of technical means (of electrically driven pump units) for pumping liquids and other incompressible and compressible fluid media.

The positive result of realizing the invention is that of achieving this purpose.

For solution of the problem with achievement of the technical result in the known electrically driven pump unit, consisting of a housing, an electrically driven armature, located in the housing, a displacer, located in the front of the housing, wherein the electrically driven armature and the displacer are connected, the electrically driven armature consists of a rear electrically driven clamp section, an electrically driven extender section capable of moving relative to the housing in the direction of variation of the electrically driven extender section length, and a front electrically driven clamp section, connected in series; according to the invention claimed, a magnetostrictive clamp section is applied as at least one electrically driven clamp section and/or a magnetostrictive extender section is applied as an electrically driven extender section.

Due to the new design of the pump unit it becomes possible to extend the existing number of technical means (of electrically driven pump units) for pumping liquids and other incompressible and compressible fluid media.

DESCRIPTION OF THE DRAWINGS

The abovementioned advantages of the invention and its features are explained in the preferred embodiments with reference to the drawings.

DESCRIPTION OF A PREFERRED EMBODIMENT

Figure 1:
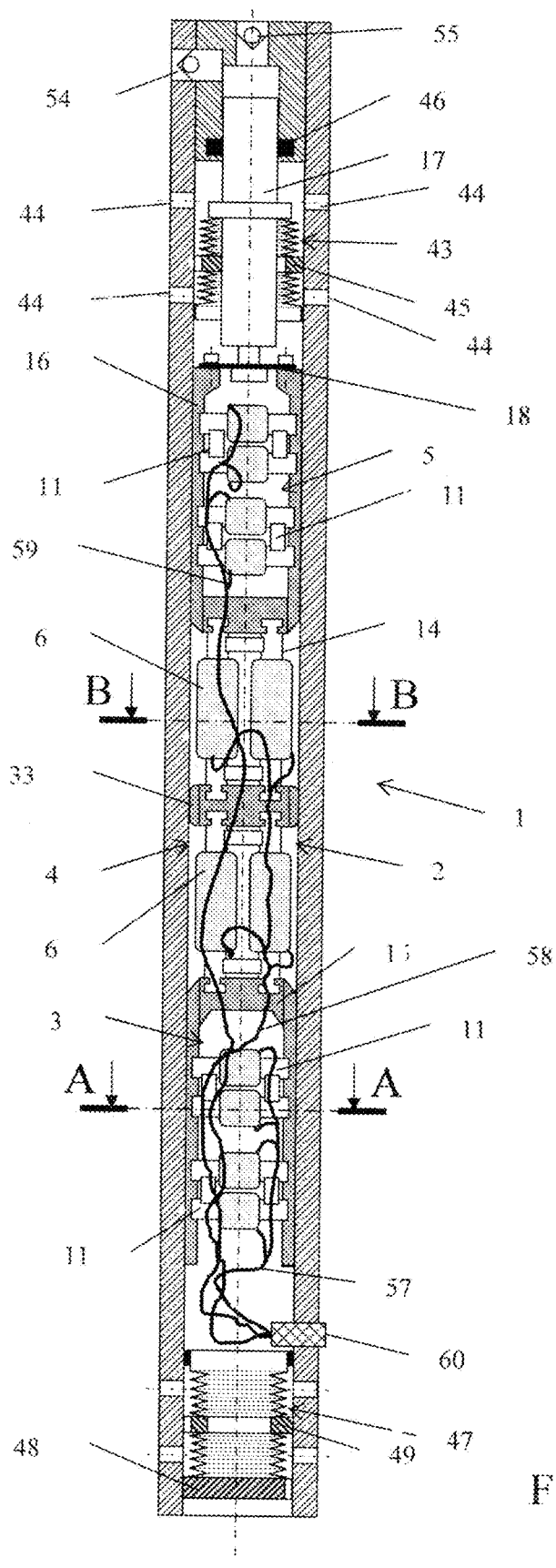
FIG. 1 shows a longitudinal cut view of the electrically driven pump unit housing with magnetostrictive clamp sections and a magnetostrictive extender section. A piston is a displacer.

The electrically driven pump unit (FIG. 1, 2, 3) comprises a tube-shaped housing 1 and an electrically driven armature 2. Magnetostrictive clamp sections may be applied as electrically driven clamp sections, magnetostrictive extender sections may be applied as an electrically driven extender sections in the pump unit (FIG. 1). The electrically driven armature 2 consists of a rear magnetostrictive clamp section 3, a magnetostrictive extender section 4 and a front magnetostrictive damp section 5, connected in series.

Figure 4:
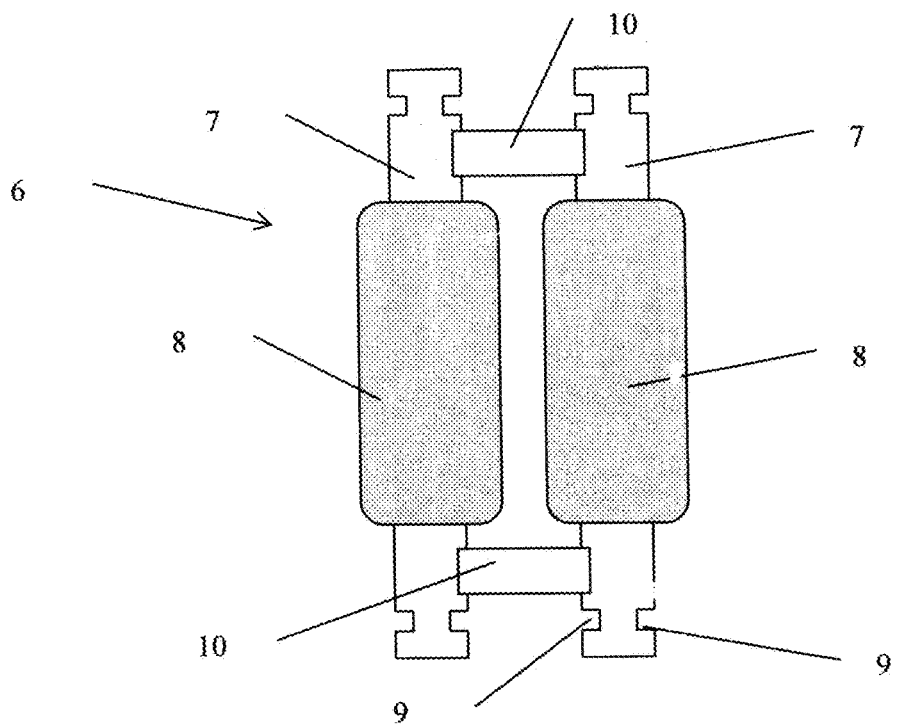
FIG. 4 is a magnetostrictive extender assembly.

The magnetostrictive extender section 4 consists of one or more series-connected magnetostrictive extender assemblies 6. The magnetostrictive extender assembly 6 (FIG. 4, 7) consists of a rectangular magnetic circuit. The induction coils 8 are disposed around two opposite rods 7 of the magnetic circuit; the rods 7 of the magnetic circuit are oriented in the direction of motion of electrically driven armature 2 (FIG. 1) and made of a magnetostrictive material. The grooves 9 are made at the ends of the rods 7 (FIG. 4) for mechanical connection of the magnetic circuits of the magnetostrictive extender assemblies in series among themselves, as well as with the front and rear clamp sections.

The other two opposite rods of the rectangular magnetic circuit are permanent magnets 10. The magnetic flux from the permanent magnet 10 coincides with the direction of magnetic flux from the induction coils 8 or is opposite to it.

Depending on the required pump unit capacity the required number of magnetostrictive extender assemblies 6 is applied in the magnetostrictive extender section 4 of the pump unit.

The rear magnetostrictive clamp section 3 (FIG. 1) consists of a U-shaped bracket 15 and a magnetostrictive clamp assemblies 11. The U-shaped bracket 15 is composed of two longitudinal bars and a transverse bar connecting them. The transverse bar of the U-shaped bracket 15 faces forwardly. The clamp assemblies 11 are disposed between the longitudinal bars of the U-shaped bracket 15.

The magnetostrictive clamp assembly 11 (FIG. 5, 6) consists of four rods, that form a magnetic circuit of a rectangular shape. There are induction coils 13 placed around two parallel opposite rods 12. The two parallel rods 12 are perpendicularly connected to the longitudinal bars of the U-shaped bracket. The rods 12 are made of magnetostrictive material.

Figure 5:
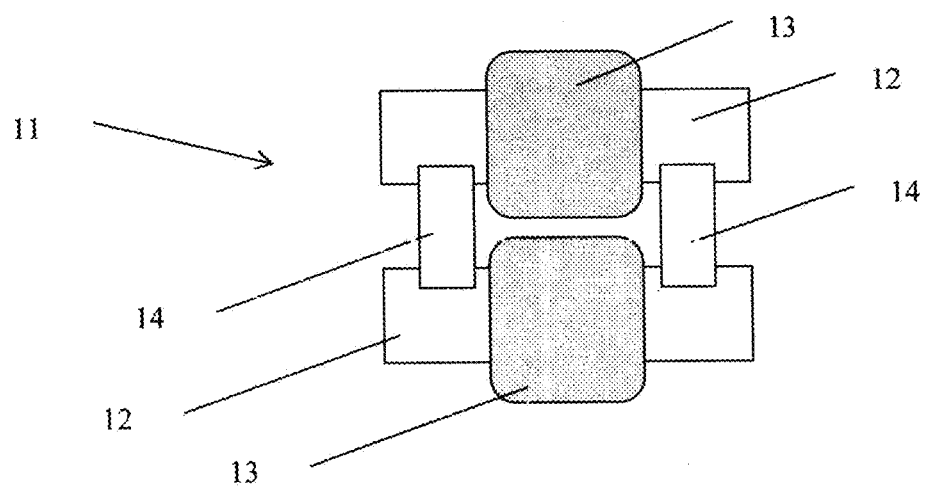
FIG. 5 is a magnetostrictive clamp assembly.
Figure 6:
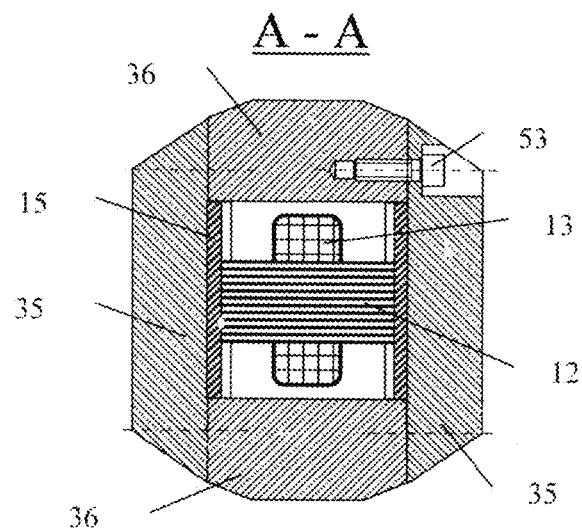
FIG. 6 is a cross-sectional view of the electrically driven pump unit at the magnetostrictive clamp section area (wires not shown)
Figure 7:
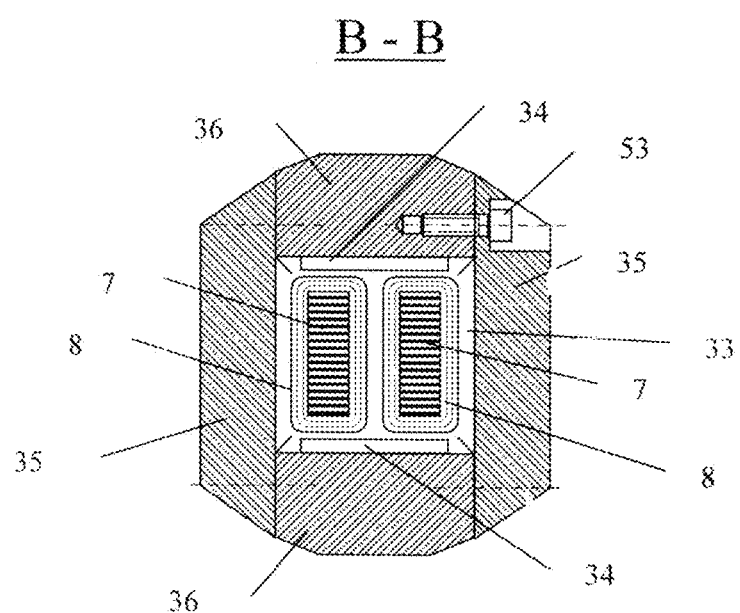
FIG. 7 is a cross-sectional view of the electrically driven pump unit at the magnetostrictive extender section area (wires not shown)
Figure 8:
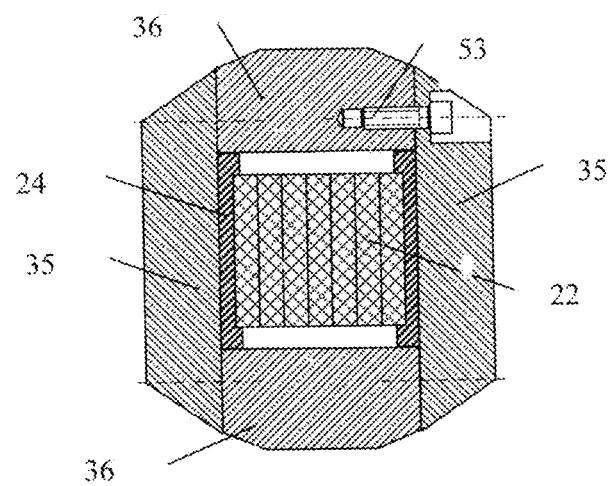
FIG. 8 is a cross-sectional view of the electrically driven pump unit at the piezoelectric clamp section area (wires not shown)

The other two opposite rods of the rectangular magnetic circuit are permanent magnets 14 (FIG. 5). The magnetic flux from the permanent magnets 14 coincides with the direction of magnetic flux from the induction coils 13 or is opposite to it.

The magnetostrictive extender section 4 at its rear part is connected to the transverse bar of the U-shaped bracket 15 of the rear magnetostrictive clamp section 3, namely with the ends of rods 7 having grooves 9 on them.

The front magnetostrictive clamp section 5 (FIG. 1) consists of a U-shaped bracket 16 and clamp magnetostrictive assemblies 11. The U-shaped bracket 16 is composed of two longitudinal bars and a transverse bar connecting them. The transverse bar of the U-shaped bracket 16 faces backwardly. The clamp assemblies 11 are disposed between the longitudinal bars of the U-shaped bracket 15. Two parallel magnetostrictive rods 12 of the magnetic circuit are perpendicularly connected to the longitudinal bars of the U-shaped bracket 16.

The magnetostrictive extender section 4 at its front part is connected to the transverse bar of the U-shaped bracket 16 of the front magnetostrictive clamp section 5, namely with the ends of rods 7 having grooves 9 on them.

Depending on the required pump unit pressure the required number of magnetostrictive clamp assemblies 11 is used in the magnetostrictive clamp sections 3 and 5 of the pump unit.

Number of induction coils 8 (FIG. 4) in each magnetostrictive extender section 13 (FIG. 5) and in each magnetostrictive clamp sections may be different, they may be located at any magnetic rod or any magnetic rods. The initial magnetization of the magnetic circuit may be zero, that means rods without residual magnetization are included into the magnetic circuit. Also, the magnetization of the magnetic circuit may be done by an additional permanent magnet or permanent magnets placed in one or few rods.

There is a displacer in the front part of the housing 1 (FIG. 1) As a displacer a piston 17 is applied. The electrically driven armature 2 and the piston 17 are connected by means of a leaf spring 18, that is fixed in the front part of the U-shaped bracket 16. The leaf spring 18 is perpendicular to the direction of movement of the piston 17. The edges of the leaf spring 18 are bolted to the front parts of the longitudinal bars of the U-shaped bracket 16. The rear part of the piston 17 is fixed in the middle of the leaf spring 18.

Figure 2:
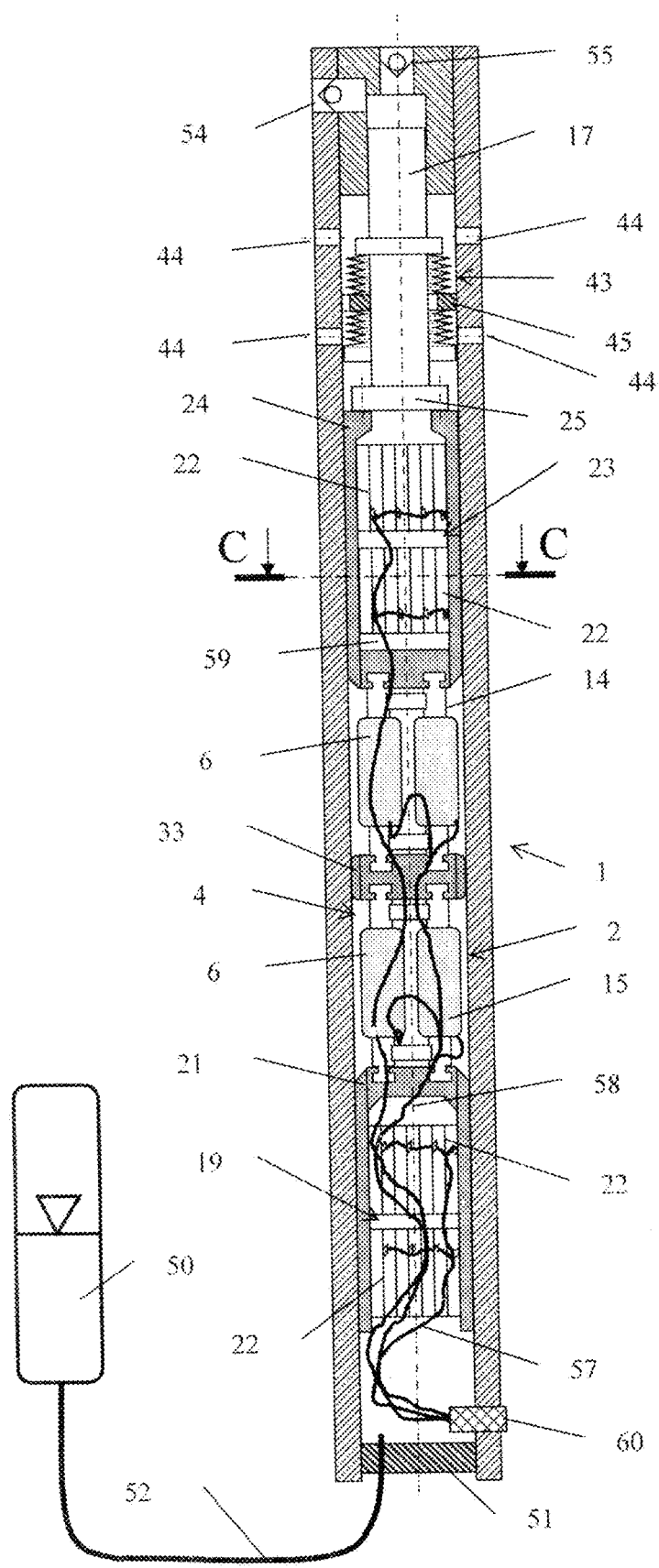
FIG. 2 is a longitudinal cut view of the electrically driven pump unit housing with piezoelectric clamp sections and a magnetostrictive extender section. A piston is a displacer.

Piezoelectric clamp sections may be applied as electrically driven clamp sections in the pump unit, as well as magnetostrictive extender section may be applied as an electrically driven extender section (FIG. 2). The electrically driven armature 2 consists of a rear piezoelectric clamp section 19, a magnetostrictive extender section 4 and a front piezoelectric clamp section 20, connected in series.

The rear piezoelectric clamp section 19 is composed of the bracket 21 and the piezostacks 22. The bracket 21 is a U-shaped part composed of two longitudinal bars and a transverse bar connecting them. The piezostacks 22 are disposed between the longitudinal bars of the bracket 21; its end parts of them are connected to these longitudinal bars. The direction of the piezostacks 22 length variation at coming voltage to them is perpendicular to the longitudinal bars of the bracket. The transverse bar of the U-shaped bracket 21 of the rear piezoelectric clamp section 19 faces forwardly.

The magnetostrictive extender section 4 at its rear part is connected to the transverse bar of the U-shaped bracket 21 of the rear piezoelectric clamp section 19, namely with the ends of rods 7 having grooves 9 on them.

The front piezoelectric clamp section 23 is composed of the bracket 24 and the piezostacks 22 (FIG. 2, 8). The bracket 24 is a U-shaped part composed of two longitudinal bars and a transverse bar connecting them. The piezostacks 22 are disposed between the longitudinal bars of the bracket 24. The direction of the piezostacks 22 length variation at coming voltage to them is perpendicular to the longitudinal bars of the bracket 24. The transverse bar of the U-shaped bracket 24 (FIG. 2) of the front piezoelectric clamp section 23 faces backwardly.

The magnetostrictive extender section 4 with its front part is connected to the transverse bar of the U-shaped bracket 24 of the front piezoelectric clamp section 23, namely with the ends of rods 7 having grooves 9 on them.

There is a displacer in the front part of the housing 1. As a displacer a piston 17 is applied. The electrically driven armature 2 and the piston 17 are connected by means of a resilient member 25, that is fixed in the front part of the U-shaped bracket 24. The rear part of the piston 17 is fixed in the middle of the resilient member 25.

Depending on the required pump unit pressure the required number of the piezostacks in the piezoelectric clamp sections 19 and 23 is comprised in the pump unit.

The front piezoelectric clamp section and the rear magnetostrictive clamp section, or the front magnetostrictive clamp section and the rear piezoelectric clamp section may be applied as electrically driven clamp sections in the pump unit, the magnetostrictive extender section as an electrically driven extender section will be applied at that.

Figure 3:
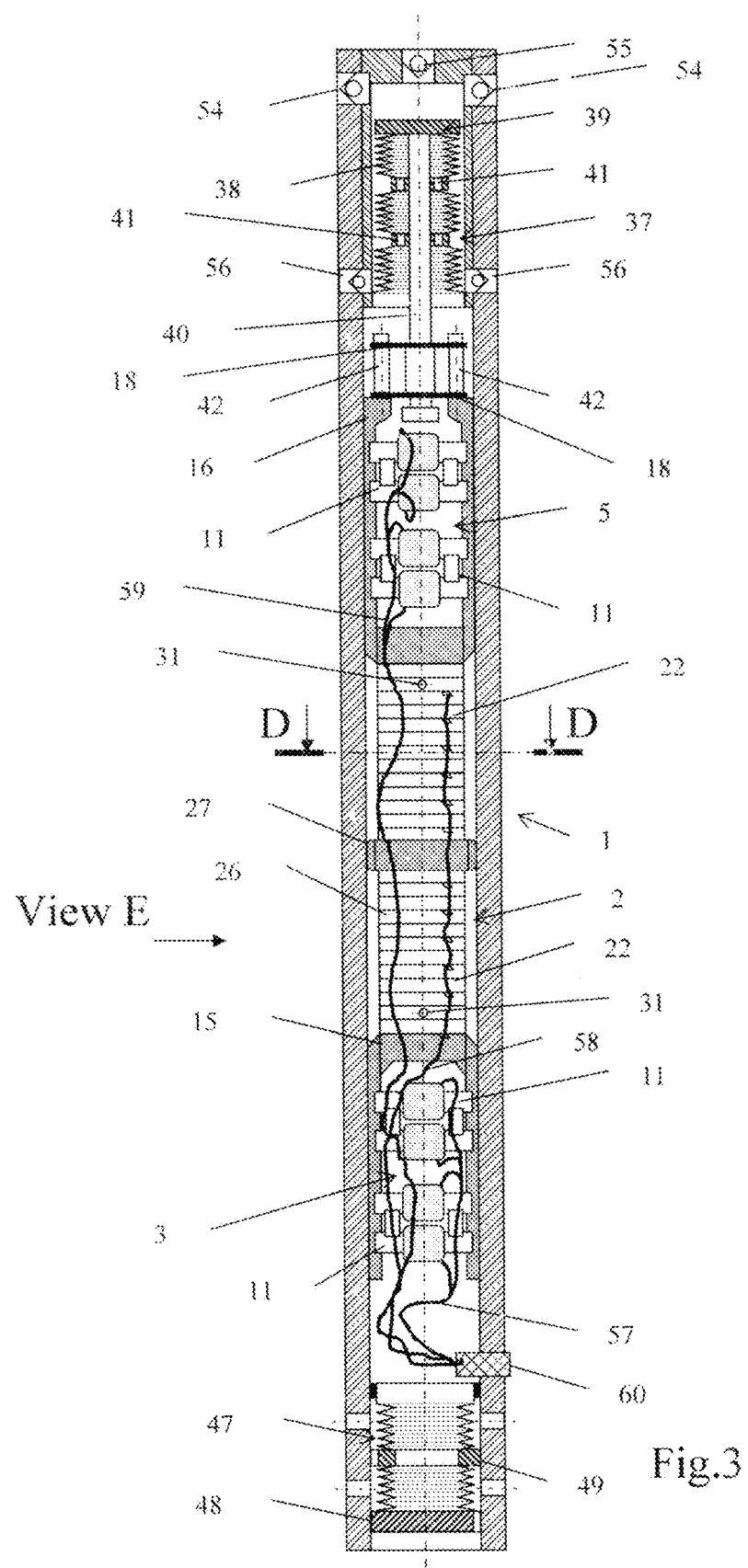
FIG. 3 is a longitudinal cut view of the electrically driven pump unit housing with magnetostrictive clamp sections and a piezoelectric extender section. A bellows is a displacer.

Magnetostrictive clamp sections may be applied as electrically driven clamp sections in the pump unit, as well as a piezoelectric extender section may be applied as an electrically driven extender section (FIG. 3). The electrically driven armature 2 consists of a rear magnetostrictive clamp section 19, a piezoelectric extender section 26 and a front magnetostrictive clamp section 20, connected in series.

There is a slide-block 27 provided in the piezoelectric extender section 26 (FIG. 3, 10) between its front and rear parts that contacts the housing 1 from inside. There may be few slide-blocks evenly distributed along the section for the long piezoelectric extender section 26. Contacting the inner walls of the housing 1 under compressive loads, the slide-blocks do not allow the piezoelectric extender section 26 to bend.

Figure 9:
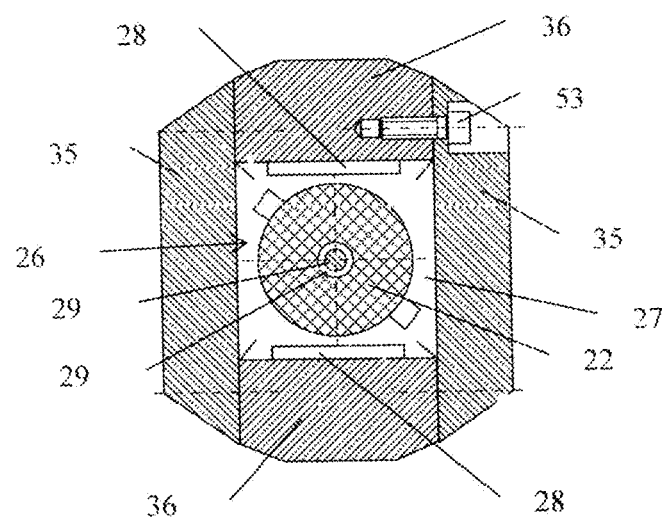
FIG. 9 is a cross-sectional view of the electrically driven pump unit at the piezoelectric extender section area (wires not shown)

The pump housing 1 may be partially or completely filled with the polyethylsiloxane liquid. Another liquid as filling liquid may be applied. For flowing of liquid while electrically driven armature 2 is moving the grooves 28 in the slide-block 27 (FIG. 9, 10) are provided thus connecting the internal housing space at back of the slide-block with the internal space at front of the slide-block.

There is a piezostack 22 (FIG. 3, 9, 10) between the front part of the piezoelectric extender section 26 and the slide-block 27. The second piezostack 22 (FIG. 1) is provided between the slide-block 27 and the rear part of the piezoelectric extender section 26. The piezostacks may be provided between the slide-blocks (at few slide-blocks) also.

Figure 10:
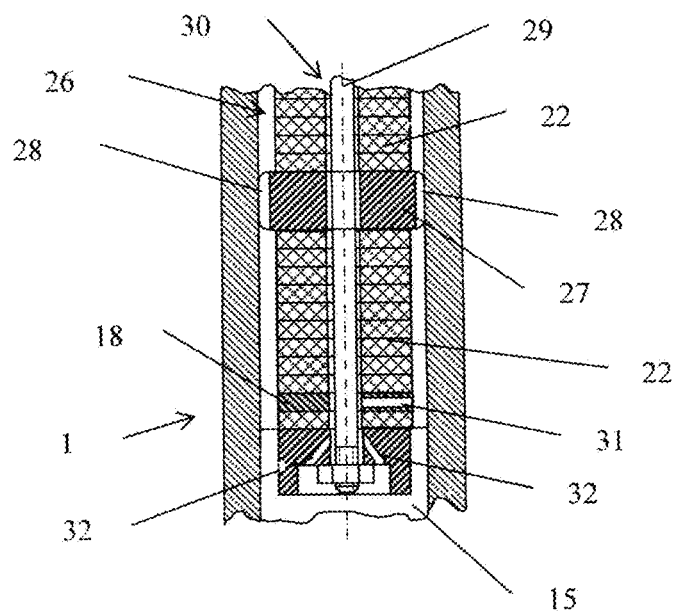
FIG. 10 is a longitudinal cut view of the piezoelectric extender section.

There is a compressing rod 29 (FIG. 9, 10) in the piezoelectric extender section. It extends from the rear part of the piezoelectric extender section 26 (FIG. 3) to its front part. The transverse bar of the U-shaped bracket 15 (FIG. 3, 10) of the rear magnetostrictive clamp section 11 and the compressing rod 29 (FIG. 10) are connected with a threaded connection. The transverse bar of the U-shaped bracket 16 (FIG. 3) of the front piezoelectric clamp section 5 and the compressing rod 29 are connected with a threaded connection also. Direction of the piezostacks 22 length variation at coming an electric voltage to them coincides with the direction of the compressing rod 29.

There is a foramen 30 (FIG. 9, 10) inside the piezoelectric extender section 26 that connects the internal space of the housing near the rear part of the piezoelectric extender section 26 with an internal space of the housing near the front part of the piezoelectric extender section, intended for additional cooling, of the piezostacks 22, as well as for possible flow of liquid through the piezoelectric extender section. There is a clearance between the piezoelectric extender section 26 and the compressing rod 29 disposed inside it; the foramen 30 is formed by a clearance between the compressing rod 16 and the piezoelectric extender section 26. Foramens may be made in the parts of the piezoelectric extender section 26 not in the location of the compressing rod 29.

In the piezoelectric extender section 26 near its rear part there are holes 31 (FIG. 3, 10) connecting the foramen 30 with the internal space of the housing 1. Also in the rear magnetostrictive clamp section 3 in the bracket 15 the holes 32 are provided connecting the foramen 30 with the internal space of the housing 1. In the piezoelectric extender section 26 near its front part there is a hole 31, connecting the foramen 30 with the internal space of the housing. Also in the front magnetostrictive clamp section 5 the holes are provided connecting the foramen 30 with the internal space of the housing 1.

The front piezoelectric clamp section and the rear magnetostrictive clamp section, or the front magnetostrictive clamp section and the rear piezoelectric clamp section may be applied as electrically driven clamp sections in the pump unit, the piezoelectric extender section as an electrically driven extender section will be applied at that.

There is a slide-block 33 provided in the magnetostrictive extender section 4 (FIG. 1, 2, 7) between its front and rear parts that contacts the housing 1 from inside. There may be few slide-blocks evenly distributed along the section for the long magnetostrictive extender section 4. Contacting the inner walls of the housing 1 under compressive loads, the slide-blocks do not allow the magnetostrictive extender section 4 to bend. Since the housing 1 of the pump unit (FIG. 1, 2) is partially or completely filled with the polyethylsiloxane liquid or another liquid, for flowing of liquid while electically driven armature 2 is moving the grooves 34 in the slide-block 33 (FIG. 10) are provided thus connecting the internal housing 1 space at back of the slide-block 33 with the internal housing I space at front of the slide-block 33.

In the pump unit the rods of the magnetic circuits can be made of plates electrically insulated from each other. Magnetostrictive material of the plates, or of solid rods of the magnetic circuit may be material with giant magnetostriction, such as terfenol-D or galfenol. Terbium and or dysprosium may be included in the content of the magnetostrictive material also.

In the pump unit, the layers and/or plates of piezostacks 22 piezoelectric material (FIG. 2, 3) may be made of piezoelectric ceramics. It may be lead zirconate, lead titanate, barium titanate, calcium titanate in any proportions in the piezoelectric ceramic composition. Thickness of the layers and or plates of piezoelectric material is in the range from 0.005 millimeter to 50 millimeters; electrodes between the layers and/or plates of piezoelectric material may be formed from silver or copper or beryllium copper thickness from 0.001 millimeter to 5 millimeters.

The bellows 37 (FIG. 3) may be applied as the displacer of the pump unit. The bellows displacer 37 consists of a bellows tube 38; a lid 39 of the bellows displacer that covers hermetically the bellows tube 38 front the front side; a rod 40 that is attached to the electrically driven armature at its one side and to the lid inside the bellows tube 38 at its other side. The rear edge of the bellows tube 38 is hermetically fastened to the housing 1 around its internal space. The bellows tube 38 may be a diaphragm type or with a radiused peaks and troughs type. At least one slide ring 41 may be introduced into the bellows displacer design, the slide ring is fixed concentrically inside the bellows tube 38 around the rod 40 and contacting it. At least one hole is made in the slide ring 41, connecting the inner spaces of the bellows tube 38 in the front and rear of the slide ring 41.

The electrically driven armature 2 and a rear part of the rod 40 are connected by means of two parallel leaf springs 18, fixed by their edges in the front part of the U-shaped bracket 16 at a certain distance from each other, the distance is provided by spacers 42. The rear part of the rod 40 is fixed in the middle of each leaf springs 18.

The housing 1 of the pumping unit may be formed at least of two parts connected to each other to form an internal space and the rear opening of the internal space. The electrically driven armature 2 is located in the internal space of the housing 1.

The housing 1 of the pumping unit may consist of two friction plates 35 (FIG. 6, 7, 8, 9) and the two cheeks 36. The friction plates 35 are arranged parallel, one plate is opposite an other plate. The cheeks 36 are attached between them forming an internal space, the front opening of the internal space and the rear opening of the internal space. The electrically driven armature 2 is located in the internal space (FIG. 1, 2, 3). The longitudinal bars of the U-shaped brackets 15, 16, 21 and 24 of the rear and front clamp sections contact the friction plates 35 from inside.

A seal section 43 (FIG. 1, 2) may be comprised in the construction of the pump unit that isolates the internal space of the housing 1, where the electrically driven sections move, from the pumped medium.

The seal section 43 is made of a liquid impermeable thin material having a peripheral edge and a hole. The seal section peripheral edge hermetically fixed in the front part of the housing 1 around its internal space opening. The piston 17 locates in the hole of the seal section. The rim of the seal section 43 hole is hermetically fixed around the piston 17 sealing the front internal space of the housing where the electrically driven sections are. The through openings 44 are provided in the housing I between the fixing place of the seal section peripheral edge and the contact area of the piston 17 with the housing 1.

The seal section 43 may be made as a flexible membrane or a diaphragm or a bellows tube. The bellows tube as a seal section can be of a membrane type or with rounded vertices and depressions on its axial cross-section. At least one slider 45 of a ring shape between the front and rear parts of the seal section 43 may be provided additionally. The slider 45 is coaxially and hermetically connected to the seal section 43, namely—to its bellows tubes. The slider 45 contacts the displacer 17. There is at least one opening in the slider 45 connecting the inner spaces of the bellows tube of the seal section 43 before and behind the slider 45.

The packing 46 (FIG. 1) may be introduced into the design of the pump unit hermetically fixed in the housing I in the area between the front electrically driven clamp section and the piston 17. The cylindrical surface of the piston 17 contacts the packing 46 from inside.

A compensator may be introduced into the design of the pump unit made of a liquid impermeable thin material. The peripheral edge of the compensator is sealed around the opening of the housing 1 to seal the interior of the housing, where the electrically driven sections situated. Wherein the housing 1 is partially or completely filled with liquid.

A compensator 47 may be provided additionally in the pump unit design (FIG. 1, 3). The compensator 47 is made of a liquid impermeable thin material such as steel or brass. The static peripheral edge of the compensator is sealed around the rear opening of the internal space of the housing 1. Wherein the housing 1 is partially or completely filled with liquid for example the polyethylsiloxane liquid. The compensator may be a flexible membrane or a diaphragm or a bellows tube. The bellows tube as a seal section can be of a membrane type or with rounded vertices and depressions on its axial cross-section. The movable edge of the bellows tube of the compensator hermetically closed with a lid 48. The lid 48 contacts the housing 1 from inside. There is at least one opening in the peripheral portion of the lid 48 connecting the outer surface of the bellows tube of the compensator 47 with the outer space. Also it may be made at least one opening in the housing 1 below the place where the peripheral edge of the compensator 47 is fixed; the opening connects the outer surface of the bellows tube of the compensator 47 with the outer space.

A slider 49 between the front and rear parts of the compensator 47 is provided additionally, it is of a ring shape. The slider 49 is coaxially and hermetically connected to the compensator 47, namely—to its bellows tube. The slider 49 contacts the housing 1 from inside. In the peripheral portion of the slider 49 ring there is an opening, connecting the outer surface of the compensator 47 bellows tube in front of the slider 49 with the outer surface of the bellows tube of the compensator 47 in the back of the slider 49.

A compensator made as a hydraulic accumulator 50 (FIG. 2) may be added to the design of the pump unit. The lid 51 closes the rear opening of the internal space of the housing 1. The internal space of the housing 1 and the accumulator 50 are connected with a pipe 52.

Parts assembling of the housing 1 is done by bolts 53 (FIG. 6, 7, 8, 9) or by threaded studs. They may be sealed with scalings and/or welding by tin, tin solder, silver solder, copper-phosphorus brazing, brass.

To provide cycling operation of the unit there are an intake valve 54 (FIG. 1, 2, 3) and an exhaust valve 55. The valves are located in the front part of the housing 1 before the displacer: the piston 17 or the bellows displacer 37. To eliminate dead zones where the contaminating particles accumulates usually, there are additional intake valves 56 (FIG. 3) near the rear outer part of the bellows displacer 37. Liquid passes at sucking through the housing 1 to the rear outer part of the bellows displacer 37 through these valves.

An electrical wire 57 with one end is connected to the electrically driven rear clamp section. An electrical wire 58 with one end is connected to the electrically driven extender section. An electrical wire 59 with one end is connected to the the electrically driven front clamp section 5. The electrical wires 57, 58 and 59 with another ends are connected to the electrical socket 60. The electrical connector 60 may locate in the housing 1, providing an electrical connection of a power cable from outside of the unit.

The power cable connected from the outside of the unit may be performed with four wires: three power wires and a common wire. Also the power cable may be configured as a shielded three-wire cable, each wire should have its independent shield in this case. Also, there may be additional wires in the cable for feedback sensors and telemetry devices.

The device operates as follows.

In the first phase of discharge the rear electrically driven clamp section is in the clamped state. That means pressing of its U-shaped bracket onto the housing 1 from inside in the transverse direction. This happens due to supply of a voltage through the electric wire 57, providing thrust. The front electrically driven clamp section in this phase is in a free state, voltage providing no thrust comes through the wire 59 to it (in a particular case this voltage is zero).

Clamping force is minimal or is absent between the U-shaped bracket of the front electrically driven clamp section and the plates of the housing 1. At the same time there is no gap. A gap indicates the incorrect settings, fault, excessive temperature or wear of the unit. The gap cause additional vibration, lowering of pressure and closest failure of the device.

The electrically driven extender section of the pump unit is in a compressed state. This is due to supply of voltage via the wire 58 to this section, that provides compression. In a particular case this voltage is zero.

In the second phase of discharge an electric voltage for extending conies through the wire 58 to the electrically driven extender section, and the section increases its length. Wherein the front clamp section connected to it moves for a short distance.

In the third phase of discharge an electrical voltage for clamping from the wire 59 comes to the front electrically driven clamp section, and its U-shaped bracket starts to press from inside on the housing 1. In other words, this section turns into the clamped state. At the same time an electric voltage providing absence of clamping comes to the wire 57. Due to that the rear electrically driven clamp section turns into the free state, not pressing from inside on the housing 1, or pressing with the least possible force. However the gap between the housing and its U-shaped bracket is also absent in this case.

In the fourth phase of discharge an electric voltage providing compression of the electrically driven extender section comes through the wire 58. This section turns into the idle state, that is, its length is decreased. The rear electrically driven clamp section moves forwardly for a short distance wherein. At the end of the fourth discharge phase an electric voltage providing releasing the front piezoelectric clamp section comes from the wire 59, it turns to the idle state and does not press from inside on the housing 1.

Such a phases rotation provides stepping displacement of electrically driven armature 2 forwardly. Since a displacer (the piston 17 or the bellows displacer 37) is connected to the moving electrically driven armature 2, then pumping fluid rifling the space between the displacer and the housing 1 moves with it forwardly. The intake valves 54 are closed wherein and the exhaust valve 55 is opened. Pressurized fluid flows out of the pump unit through it.

Phases sequence is repeated at discharge many times until the displacer of the pumped fluid reaches its extreme front position. That moment is determined from a curve of the electric current changing in the wire 58. Also this moment can be monitored by means of a feedback sensor of the electrically driven armature 2 or the displacer.

Sucking starts after the displacer of the pumped fluid reaches its extreme front position. In the first phase of suction the rear electrically driven clamp section is in a free state, that is, the U-shaped bracket does not press on the housing 1 from inside, or it presses with minimal force.

In the second phase of suction an electrically driven extender section increases its length. Wherein the rear electrically driven clamp section is moved back at a short distance.

In the third phase of suction the front electrically driven clamp section turns to its free state. At the same time the rear electrically driven clamp section turns into the clamped state, that is starting to press on the housing 1 from inside.

In the fourth phase of the suction the electrically driven extender section turns into the free state, that is, reduces its length. The front electrically driven clamp section moves backward for a short distance.

Such a phases sequence is repeated at suction many times until the fluid displacer reaches its extreme rear position. The moment when the extreme rear position is reached is determined from curve of the electric current changing in the wire 58. Also this moment can be monitored by means of the feedback sensor of the electrically driven sections extreme rear position (not shown in the drawings).

As the piston is connected to the electrically driven armature 2 moving back, the pumped fluid is sucked with movement of the piston. The intake valves 54 are opened and the exhaust valve 55 is closed.

The compensator 47 or 50 compensates the volume variation of the liquid filling the housing 1 by changing its capacity, when the displacer moves up or down.

The resilient member between the displacer and the electrically driven armature 2 reduces vibration transmitted to the displacer resulting from the movement of electrically driven armature 2. This reduces the possibility of cavitation of the fluid pumped, as well as longitudinal vibration of the unit.

USAGE IN THE INDUSTRY

The most successfully the claimed electrically driven pump is industrially applicable in transport and industry for pumping fluids of high pressure and relatively low supply, where usage of other types of pumps is hardly possible due to dimensions, weight and effectiveness; also it is applicable at production of oil from oilwells.

The invention claimed is:

1. An electrically driven pump unit, comprising a housing, an electrically driven armature, located in the housing, a fluid displacer for pumped fluid, located in the front of the housing, wherein the electrically driven armature and the fluid displacer for pumped fluid are connected, the electrically driven armature comprising a rear electrically driven clamp section, an electrically driven extender section capable of moving relative to the housing in the direction of its length variation, and a front electrically driven clamp section, connected in series, a magnetostrictive clamp section is applied as at least one of the rear or front electrically driven clamp section and a magnetostrictive extender section is applied as the electrically driven extender section, wherein the magnetostrictive extender section comprises at least one magnetostrictive extender assembly; the magnetostrictive extender assembly comprises four rods forming a rectangular magnetic circuit, wherein at least one induction coil is disposed around at least one rod of the magnetic circuit; two rods of magnetic circuit are oriented in the direction of motion of the electrically driven armature and made of a magnetostrictive material; and the magnetostrictive extender assemblies are mechanically connected in series among themselves with their magnetostrictive circuits.

2. The pump unit according to claim 1, wherein at least one rod of the magnetic circuit is a permanent magnet, the magnetic flux from the permanent magnet in the magnetic circuit coincides with the direction of magnetic flux from the induction coil or is opposite to the magnetic flux from the induction coil.

3. The pump unit according to claim 1, wherein the rear electrically driven clamp section consists of a U-shaped bracket and at least one magnetostrictive clamp assembly; the U-shaped bracket is composed of two longitudinal bars and a transverse bar connecting them; the transverse bar of the U shaped bracket faces forwardly; the magnetostrictive clamp assembly is disposed between the longitudinal bars of the U-shaped bracket; the magnetostrictive clamp assembly comprises four rods, wherein said rods are disposed in two groups of two parallel rods that form a magnetic circuit of a rectangular shape; there is at least one induction coil located around one rod of the a magnetic circuit; the two parallel rods of the magnetic circuit are perpendicularly connected to the longitudinal bars of the U-shaped bracket and made of magnetostrictive material; the electrically driven extender section with its rear part is connected to the transverse bar of the U-shaped bracket of the rear electrically driven clamp section.

4. The pump unit according to claim 3, wherein at least one rod of the magnetic circuit is a permanent magnet; the direction of the magnetic flux from the permanent magnet in the magnetic circuit coincides with the direction of magnetic flux from the induction coil or is opposite to the direction the magnetic flux from the induct on coil.

5. The pump unit according to claim 1, wherein the front electrically driven clamp section consists of a U-shaped bracket and at least one magnetostrictive clamp assembly; the U-shaped bracket comprises two longitudinal bars and a transverse bar connecting them; the transverse bar of the U-shaped bracket faces backwardly; the magnetostrictive clamp assembly is disposed between the longitudinal bars of the U-shaped bracket; the magnetostrictive clamp assembly comprises four rods, wherein said rods are disposed in two groups of two parallel rods that form a magnetic circuit of a rectangular shape; there is at least one induction coil located around at least one rod; the two parallel rods of the magnetic circuit are perpendicularly connected to the longitudinal bars of the U-shaped bracket and made of magnetostrictive material; the electrically driven extender section with its front part is connected to the transverse bar of the U-shaped bracket of the front electrically driven clamp section.

6. The pump unit according to claim 5, wherein at least one rod of the magnetic circuit is a permanent magnet; the direction of the magnetic flux from the permanent magnet in the magnetic circuit coincides with the direction of magnetic flux from the induction coil or is opposite to the direction the magnetic flux from the induct on coil.

7. The pump unit according to claim 1, wherein the rear electrically driven clamp section comprising a U-shaped bracket, and at least one piezostack; the U-shaped bracket is composed of two longitudinal bars and a transverse bar connecting them; the piezostack is disposed between the longitudinal bars of the U-shaped bracket; the transverse bar of the U-shaped bracket faces forwardly; the electrically driven extender section with its rear part is connected to the transverse bar of the U-shaped bracket of the rear electrically driven clamp section.

8. The pump unit according to claim 1, wherein the front electrically driven clamp section is comprising a U-shaped bracket and at least one piezostack; the U-shaped bracket is composed of two longitudinal bars and a transverse bar connecting them; the piezostack is disposed between the longitudinal bars of the U-shaped bracket; the transverse bar of the U-shaped bracket faces backwardly; the electrically driven extender section with its front part is connected to the transverse bar of the U-shaped bracket of the front electrically driven clamp section.

9. The pump unit according to claim 1, wherein the magnetostrictive material is a giant magnetostriction material.

10. The pump unit according to claim 1, wherein the magnetostrictive material is terfenol-D or galfenol.

11. The pump unit according to claim 1, wherein terbium and/or dysprosium is included in the content of the magnetostrictive material.

12. The pump unit according to claim 1, wherein rods of the magnetic circuits are made of plates electrically insulated from each other.

* * * * *